US012656392B2

(12) United States Patent
Seeger et al.

(10) Patent No.: US 12,656,392 B2
(45) Date of Patent: Jun. 16, 2026

(54) MEASUREMENT SYSTEM AND TEST INSTRUMENT

(71) Applicant: Rohde & Schwarz GmbH & Co. KG, Munich (DE)

(72) Inventors: Julius Seeger, Munich (DE); Jakob Hammer, Munich (DE); Thorsten Lueck, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 119 days.

(21) Appl. No.: 18/423,869

(22) Filed: Jan. 26, 2024

(65) Prior Publication Data

US 2025/0244382 A1 Jul. 31, 2025

(51) Int. Cl.
*G01R 31/28* (2006.01)
*G08B 21/18* (2006.01)

(52) U.S. Cl.
CPC ....... *G01R 31/2893* (2013.01); *G08B 21/182* (2013.01)

(58) Field of Classification Search
CPC .......................... G01R 31/2893; G08B 21/182
USPC ......................................................... 340/540
See application file for complete search history.

(56) References Cited

U.S. PATENT DOCUMENTS 4,357,574 A * 11/1982 Takamisawa .......... G01R 31/36
                                                                    324/426
6,897,670 B2 * 5/2005 Burns ................ G01R 31/2893
                                                                    324/750.02

8,581,738 B2 * 11/2013 Maggiore ............. G06T 19/006
                                                                    340/686.1
9,013,296 B2 * 4/2015 Clarke ................. G01R 19/155
                                                                    340/514
9,285,253 B2 * 3/2016 Brockhaus ............. G01D 18/00
9,458,608 B1 * 10/2016 Chevalier ............... E03B 7/071
10,345,421 B2 * 7/2019 Leibfritz ................ G01R 27/04
10,380,863 B2 * 8/2019 Wedig .................... G08B 17/06
11,075,512 B1 * 7/2021 Noonan ............... G01R 21/133
11,636,752 B2 * 4/2023 Cai ....................... G05B 23/021
                                                                    340/679
11,653,127 B2 * 5/2023 Meißner ............. G07C 5/0808
                                                                    340/870.07
11,879,944 B2 * 1/2024 Skow ..................... G08C 17/02
2007/0139183 A1 * 6/2007 Kates ................... G08B 25/005
                                                                    340/539.22

(Continued)

*Primary Examiner* — Zhen Y Wu
(74) *Attorney, Agent, or Firm* — CHRISTENSEN O'CONNOR JOHNSON KINDNESS PLLC

(57) ABSTRACT

A measurement system includes a test instrument, a monitoring circuit, a dispatching circuit, and an electronic device. The test instrument includes a testing circuit configured to conduct measurements on a measurement signal received from a device under test and/or to generate a test signal for the device under test. The monitoring circuit is configured to monitor a status of the at least one test instrument, wherein the status is associated with a measurement being performed on the device under test. The monitoring circuit is configured to generate an alert signal if a status change of the at least one test instrument requiring an external action is detected. The dispatching circuit is configured to transmit the alert signal to the electronic device. The electronic device can be established separately from the test instrument. Further, a test instrument is described.

16 Claims, 3 Drawing Sheets

(56)    References Cited

U.S. PATENT DOCUMENTS

| | | | |
|---|---|---|---|
| 2009/0109021 A1* | 4/2009 | Paoletti | G01R 31/343 |
| | | | 702/184 |
| 2010/0019913 A1* | 1/2010 | Rodseth | H02H 3/046 |
| | | | 340/638 |
| 2012/0118989 A1* | 5/2012 | Buescher | F24H 15/414 |
| | | | 236/51 |
| 2012/0161966 A1* | 6/2012 | Tan | G06F 11/3055 |
| | | | 340/540 |
| 2013/0340112 A1* | 12/2013 | Boukharov | C12Q 1/6874 |
| | | | 536/23.6 |
| 2016/0031080 A1* | 2/2016 | Rey | B25J 19/0091 |
| | | | 901/22 |
| 2016/0196730 A1* | 7/2016 | Pandey | G08B 17/06 |
| | | | 340/650 |
| 2017/0315206 A1* | 11/2017 | Leibfritz | G01R 13/02 |
| 2019/0120677 A1* | 4/2019 | Arunachalam | G01F 15/063 |
| 2019/0139377 A1* | 5/2019 | Fayfield | G08B 5/36 |
| 2019/0200009 A1* | 6/2019 | Lo | H04N 17/04 |
| 2020/0175459 A1* | 6/2020 | Chee | G06Q 10/06 |
| 2020/0191864 A1* | 6/2020 | Suga | G01R 31/2829 |
| 2020/0192344 A1* | 6/2020 | O'Connor | G05B 23/0221 |
| 2020/0380836 A1* | 12/2020 | Harrison | G08B 21/14 |
| 2020/0401124 A1* | 12/2020 | Dillon | G05B 23/0283 |
| 2021/0181289 A1* | 6/2021 | Held | G01R 35/005 |
| 2022/0034967 A1* | 2/2022 | Strickling | G01R 1/07385 |
| 2023/0266380 A1* | 8/2023 | Werner | G01R 31/2893 |
| | | | 324/750.13 |
| 2024/0333739 A1* | 10/2024 | Agrawal | H04L 63/1425 |

* cited by examiner

MEASUREMENT SYSTEM AND TEST INSTRUMENT

FIELD OF THE DISCLOSURES

Embodiments of the present disclosure generally relate to a measurement system. Embodiments of the present disclosure further relate to a test instrument.

BACKGROUND

Many types of electronic devices have to be tested and/or calibrated after manufacturing in order to ensure a correct functionality of the respective device under test. Further, certain electronic devices, e.g. test and/or measurement instruments, need to be calibrated in certain time intervals in order to ensure their correct functionality.

Such end-of-line tests and calibrations often require several measurement steps, wherein the measurement setup may have to be modified between the individual measurement steps.

In order to avoid down-times of these measurements that may lead to extra costs, operators have to manually monitor the status of the measurements. Depending on the size of the manufacturing facility, the operators may have to monitor a large number of measurements that are performed simultaneously.

Thus, there is a need for a measurement system that facilitates monitoring the status of measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a measurement system. In an embodiment, the measurement system comprises at least one test instrument, a monitoring circuit, a dispatching circuit, and at least one electronic device. The at least one test instrument comprises a testing circuit, wherein the testing circuit is configured to conduct measurements on a measurement signal received from a device under test and/or to generate a test signal for the device under test. The monitoring circuit is configured to monitor a status of the at least one test instrument, wherein the status is associated with a measurement being performed on the device under test. The monitoring circuit is configured to generate an alert signal if a status change of the at least one test instrument requiring an external action is detected. The dispatching circuit is configured to transmit the alert signal to the at least one electronic device, wherein the at least one electronic device is established separately from the at least one test instrument.

As used herein, the term "external action" is understood to denote an action that cannot be performed by the at least one test instrument itself. In some embodiments, the external action may relate to a physical change of the measurement setup. For example, the external action may be or comprise changing cables of the measurement system, adapting connections within the measurement system, removing a device under test from the measurement setup, providing a new device under test in the measurement setup, performing a calibration of the at least one test instrument, etc.

The measurement system according to the present disclosure is based on the idea to automatically monitor the at least one test instrument for status changes regarding the measurement being performed by the at least one test instrument. The measurement being performed may, for example, be a measurement that is performed on a device under test in order to assess the performance of the device under test and/or in order to calibrate a device under test.

If a status change requiring an external action is detected by the monitoring circuit, the alert signal is automatically transmitted to the at least one electronic device. For example, the status change requiring an external action may comprise an event like "measurement is finished", "different cabling/connections are required in order to continue the measurement", "test instrument has to be calibrated in order to continue the measurement", etc.

As will be described in more detail below, the electronic device may be a mobile communication device of a human operator, an external computer device of a human operator, a shared screen, an automated operator robot capable of performing the action required, etc. Thus, the human operator or the automated operator robot is alerted immediately when the status change requiring the external action is detected, such that the human operator or the automated operator robot can perform the required external action in a timely manner. Accordingly, down-times within the measurement system according to the present disclosure are reduced compared to manually monitored measurement systems. Further, monitoring of the measurement system is facilitated, making the measurement system according to the present disclosure easier to operate.

In an embodiment of the present disclosure, the at least one test instrument comprises the monitoring circuit. Accordingly, at least one test instrument may be configured to monitor its own status regarding the measurement being performed on the device under test.

According to an aspect of the present disclosure, the at least one electronic device comprises, for example, a mobile communication device of an operator, an external computer device of an operator, and/or a shared screen. Thus, the operator is automatically alerted to the required external action by the alert signal being transmitted to the at least one electronic device, such that the operator can perform the required external action in a timely manner. Accordingly, down-times can be reduced effectively.

For example, the at least one electronic device may be a smartphone, a tablet, or any other suitable type of smart device. As another example, the at least one electronic device may be a wearable electronic device, e.g. a smartwatch, smart glasses or another type of head mounted display. In another example, the at least one electronic device may be a computing device such as a personal computer or a laptop.

In a further example, the at least one electronic device may be or comprise a shared screen that is associated with a plurality of test instruments. The shared screen may be configured to display alert signals (and/or the at least one operator task described below) associated with a plurality of test instruments of the measurement system simultaneously. For example, the shared screen may be mounted in a central location or in another suitable location in a facility comprising the measurement system.

In an embodiment of the present disclosure, the at least one electronic device comprises an automated operator robot capable of performing the action required. Accordingly, the automated operator robot is automatically alerted to the required external action by the alert signal being transmitted to automated operator robot, such that the automated operator robot may automatically perform the required external action in a timely manner. Accordingly, down-times can be reduced effectively.

In an embodiment, the at least one test instrument may comprise an alert circuit, wherein the alert circuit is configured to generate a visual alert and/or an acoustic alert based on the alert signal. Thus, in addition to the alert signal being transmitted to the at least one external device, the human operator and/or the automated operator robot may be alerted to the required external action by the visual alert and/or by the acoustic alert. For example, different types of visual alerts and/or acoustic alerts may be generated depending on the type of the external action required.

In an embodiment, the automated operator robot may be configured to recognize the generated visual alert and/or the generated acoustic alert, and to perform the external action associated with the generated visual alert and/or the generated acoustic alert.

A further aspect of the present disclosure provides that the dispatching circuit is configured, for example, to generate at least one operator task if the status change of the at least one test instrument requiring the external action is detected. In general, the at least one operator task may comprise information on the external action required, such that the human operator or the automated operator robot receives all information necessary for performing the external action required.

For example, the at least one operator task may comprise a list of steps that need to be performed for the external action required. In some embodiments, the at least one operator task may comprise instructions for the actions that have to be performed.

According to another aspect of the present disclosure, the dispatching circuit is configured, for example, to transmit the at least one operator task to the at least one electronic device. Thus, the information necessary for performing the external action required is automatically transmitted to the human operator and/or to the automated operator robot.

In an embodiment, the at least one electronic device may be configured to display the at least one operator task. In other words, the information regarding the step(s) to be performed may be displayed on a display of the at least one electronic device.

In an embodiment of the present disclosure, the at least one electronic device is configured to receive a user input, the user input indicating whether the at least one operator task is accepted or declined. Accordingly, the human operator or the automated operator robot can choose to accept or decline the at least one operator task associated with the required external action.

In an embodiment, the information on whether the at least one operator task has been accepted or declined may be transmitted back to the dispatching circuit.

According to an aspect of the present disclosure, the dispatching circuit is configured, for example, to transmit the at least one operator task to at least one further electronic device if the at least one operator task is declined. Thus, it is ensured that the required external action associated with the at least one operator task is resolved even if the at least one operator task is declined by a human operator or by an automated operator robot.

Alternatively or additionally, the dispatching circuit may be configured to transmit the at least one operator task to several electronic devices simultaneously. If one of the electronic devices accepts the at least one operator task, a corresponding confirmation signal may be transmitted to the dispatching circuit, and the dispatching circuit may be configured to delete the at least one operator task for the other electronic devices by sending a corresponding signal to the other electronic devices.

In an embodiment, it is also conceivable that the dispatching circuit may transmit reminder messages to the at least one external device if the at least one operator task is open, i.e. unresolved, for a predefined period of time.

Another aspect of the present disclosure provides that the at least one electronic device is configured, for example, to receive or generate an operator input, the operator input indicating that the at least one operator task has been completed, wherein the at least one electronic device is configured to generate a confirmation signal based on the operator input. The confirmation signal may be transmitted to the dispatching circuit, which may delete the at least one completed operator task from a list of open operator tasks. Alternatively or additionally, the confirmation signal may be transmitted to the at least one test instrument.

In a further embodiment of the present disclosure, the at least one test instrument is configured to perform a test step and/or a calibration step based on the confirmation signal. Thus, the at least one test instrument may automatically resume the measurement or start a new measurement upon receiving the confirmation that the external action required for performing the measurement has been completed, thereby minimizing the down-time of the at least one test instrument.

A further aspect of the present disclosure provides that the at least one test instrument is configured, for example, to receive an operator input, the operator input indicating that the at least one operator task has been completed, wherein the at least one test instrument is configured to generate a confirmation signal based on the operator input. The confirmation signal may be transmitted to the dispatching circuit, which may delete the at least one completed operator task from a list of open operator tasks.

In an embodiment, the at least one electronic device may be an automated operator robot, wherein the automated operator robot is configured to automatically perform the at least one operator task. Accordingly, the at least one operator task may be resolved automatically without an intervention of a human operator being necessary.

In an embodiment of the present disclosure, the dispatching circuit is configured to transmit the at least one operator task to the at least one electronic device based on at least one criterion.

In an embodiment, the at least one criterion relates to a distance of the at least one electronic device from the at least one test instrument, to a number of open tasks of the at least one electronic device, and/or to a user of the at least one electronic device.

For example, the at least one operator task may first be transmitted to the electronic device being closest to the at least one test instrument. If the at least one operator task is declined by that electronic device, the at least one operator task may be transmitted to the second-closest electronic device, etc.

As another example, the at least one operator task may first be transmitted to the electronic device having the lowest number of open operator tasks. If the at least one operator task is declined by that electronic device, the at least one operator task may be transmitted to the electronic device having the second-lowest number of operator tasks, etc.

In another example, the at least one operator task may be transmitted to an electronic device that is associated with a human operator having experience and/or specialized knowledge for the required external action associated with the at least one operator task.

A further aspect of the present disclosure provides that the dispatching circuit, for example, is integrated into the at least one test instrument. Thus, the at least one test instrument is configured to automatically alert the at least one electronic device to the external action required.

In an embodiment, the dispatching circuit may be configured to transmit the alert signal to the at least one electronic device directly or indirectly.

In an embodiment, the dispatching circuit, for example the dispatching circuit being integrated into the at least one test instrument, may transmit the alert signal (and the at least one operator task described above) indirectly via a computing device that is interconnected between the at least one test instrument and the at least one electronic device. For example, the computing device may be server.

Alternatively, the dispatching circuit, for example the dispatching circuit being integrated into the at least one test instrument, may transmit the alert signal (and the at least one operator task described above) directly to the at least one electronic device via a suitable wired or wireless connection, for example via Ethernet, Bluetooth, WLAN, 4G, and/or 5G.

In a further embodiment of the present disclosure, the measurement system further comprises at least one computing device, wherein the dispatching circuit is integrated into the at least one computing device. For example, the computing device may be a server, a personal computer, a laptop, a smartphone, a tablet, or any other suitable type of smart device.

Another aspect of the present disclosure provides that the at least one test instrument comprises, for example, a vector network analyzer. However, it is to be understood that the at least one test instrument may be or comprise any other type of test and/or measurement instrument, for example a signal analyzer, a spectrum analyzer, an oscilloscope, a signal generator such as an arbitrary waveform generator, etc.

Embodiments of the present disclosure further provide a test instrument. In an embodiment, the test instrument comprises a testing circuit, wherein the testing circuit is configured to conduct measurements on a measurement signal received from a device under test and/or to generate a test signal for the device under test. The test instrument further comprises a monitoring circuit, wherein the monitoring circuit is configured to monitor a status of the at least one test instrument, wherein the status is associated with a measurement being performed on the device under test. The monitoring circuit is configured to generate an alert signal if a status change of the at least one test instrument requiring an external action is detected. The monitoring circuit is configured to transmit the alert signal to a dispatching circuit.

In an embodiment, the dispatching circuit may be integrated into the test instrument. For example, the test instrument may be a vector network analyzer. However, it is to be understood that the test instrument may be any other type of test and/or measurement instrument.

Regarding the further advantages and properties of the test instrument, reference is made to the explanations given above with respect to the measurement system, which also hold for the test instrument and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
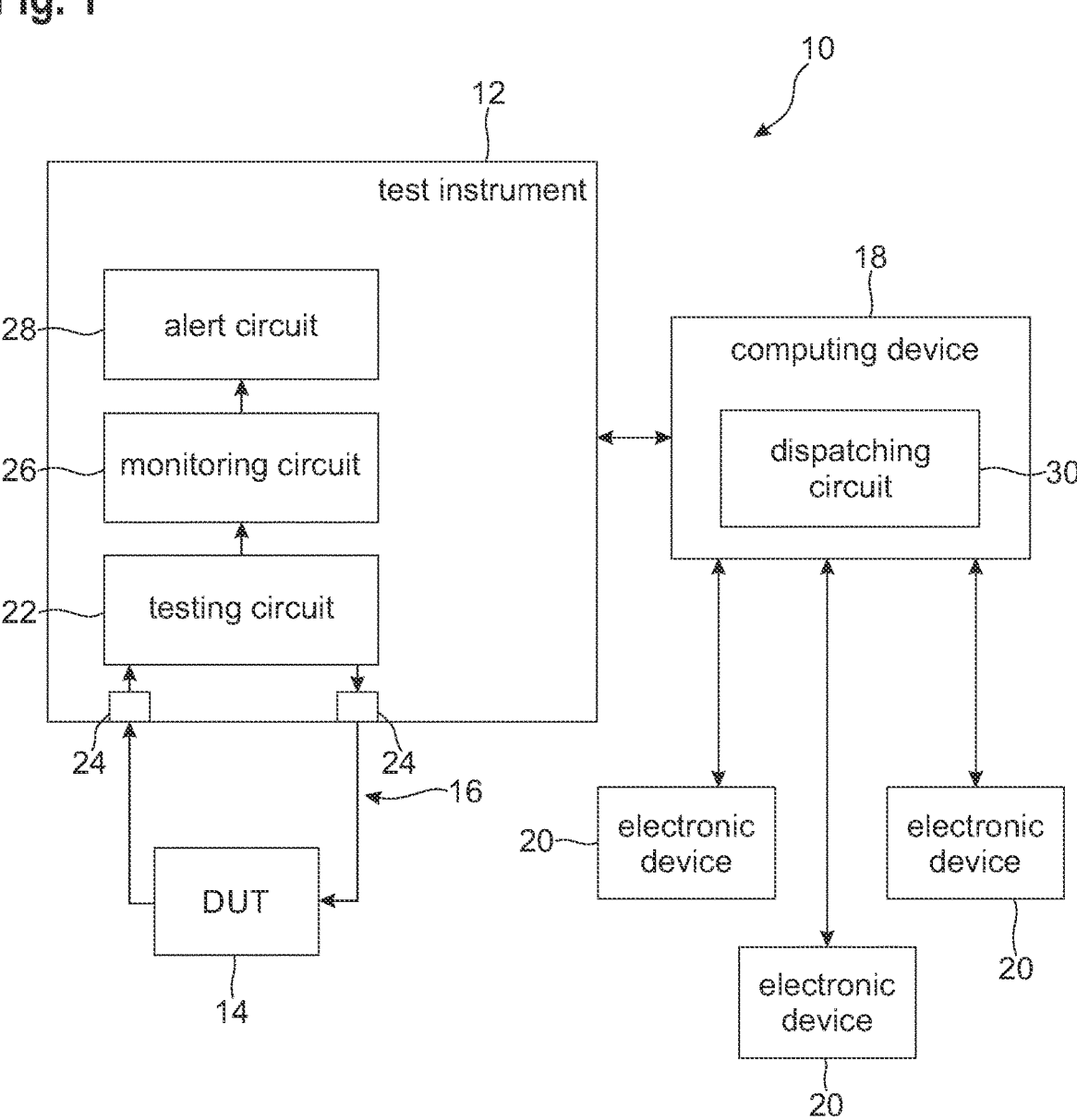
FIG. 1 schematically shows a measurement system according to an embodiment of the present disclosure.

FIG. 1 schematically shows an example of a measurement system 10 comprising a test instrument 12 and a device under test 14. In general, the device under test 14 may be any type of electronic device that requires testing after fabrication and/or a calibration.

For example, the device under test 14 may be a mobile communication device such as a smartphone, a pager, a smartwatch, a tablet, an augmented reality system such as smart glasses or another type of head mounted display, etc. As another example, the device under test 14 may be an RF device being configured to receive and process an RF signal, such as an amplifier, an attenuator, a filter, a mixer, etc. In a further example, the device under test 14 may be a measurement instrument that is to be tested and/or calibrated, for example a vector network analyzer, an oscilloscope, a spectrum analyzer, a signal generator, etc.

In general, the test instrument 12 is configured to perform measurements on the device under test 14 in order to assess a performance of the device under test 14 and/or in order to calibrate the device under test 14. The type of the test instrument 12 may depend on the type of the device under test 14 to be tested. For example, the test instrument 12 may be a vector network analyzer. However, it is to be understood that the test instrument 12 may be any other type of test and/or measurement instrument, such as an oscilloscope, a spectrum analyzer, a signal generator, or a spectrum analyzer.

In an embodiment, the measurement system 10 may comprise several test instruments that perform measurement on a single device under test or on several devices under test.

Without restriction of generality, the example embodiment of the measurement system 10 shown in FIG. 1 is described hereinafter. The measurement system 10 may further comprise connecting components 16 that connect the test instrument 12 with the device under test 14. For example, the connecting components may comprise cables, connectors, switch matrices, directional couplers, etc.

The measurement system 10 further comprises a computing device 18 that is established separately from the test instrument 12 and from the device under test 14. For example, the computing device 18 may be a server, a personal computer, a laptop, a smartphone, a tablet, or any other suitable type of smart device comprising, for example, processor circuitry.

In the embodiment shown, at least one electronic device 20 is provided in the measurement system 10. The at least one electronic device 20 is established, for example, separately from the test instrument 12, the device under test 14, and the computing device 18. In the example embodiment shown in FIG. 1, three electronic devices 20 are provided. However, it is to be understood that the measurement system 10 may comprise any other number of electronic devices 20.

The at least one electronic device 20 may be or comprise a mobile communication device of a human operator, such as a smartphone, a tablet, etc. As another example, the at least one electronic device 20 may be or comprise a wearable electronic device, e.g. a smartwatch, smart glasses or another type of head mounted display. In another example, the at least one electronic device 20 may be or comprise an external computer device such as a personal computer or a laptop.

In a further example, the at least one electronic device 20 may be or comprise a shared screen that is associated with a plurality of test instruments 12. For example, the shared screen may be mounted in a central location or in another suitable location in a facility comprising the measurement system 10.

Alternatively or additionally, the at least one electronic device 20 may be or comprise an automated operator robot that is configured to automatically perform certain tasks in the measurement system 10.

In general, the individual devices of the measurement system 10 cooperate in order to facilitate monitoring a status of a measurement performed by the test instrument 12 on the device under test 14.

In the embodiment shown, the test instrument 12 comprises a testing circuit 22 that is connected to the device under test 14 via at least one port 24 of the test instrument 12. The testing circuit 22 is configured to conduct measurements on a measurement signal received from the device under test 14 and/or to generate a test signal for the device under test 14.

In an embodiment, the test instrument 12 further comprises a monitoring circuit 26 that is configured to monitor a status of the at least one test instrument 12. For example, the monitoring circuit 26 is configured to monitor a status of the test instrument 12, for example of the testing circuit 22, that is associated with a measurement being performed on the device under test 14.

If the monitoring circuit 26 detects a status change of the monitored status that requires an external action to be performed, the monitoring circuit 26 generates an alert signal that indicates that a status change has occurred that requires the external action. In some embodiments, the alert signal may comprise additional information on the status change.

For example, the alert signal may comprise information on a type of the status change, information on the measurement performed before the status change, an identification of the test instrument 12, configuration data comprising information on operational parameters of the test instrument 12, etc.

Optionally, the test instrument 12 may comprise an alert circuit 28 that is configured to receive the alert signal and to generate a visual alert and/or an acoustic alert based on the alert signal. For example, the alert circuit 28 may comprise a light source, such as an LED, that is configured to generate the visual alert. Alternatively or additionally, the alert circuit 28 may comprise an acoustic speaker that is configured to generate the acoustic alert.

In some embodiments, the alert circuit 28 may be configured to generate different types of visual alerts and/or acoustic alerts depending on the type of the external action required. The different types of alerts may comprise different light colors, different light blinking patterns, different alarm sounds, etc.

In an embodiment, the monitoring circuit 26 or the test instrument 12 is configured to transmit the alert signal to the computing device 18, for example to a dispatching circuit 30 that is integrated into the computing device 18. The alert signal may be transmitted by any suitable type of wired and/or wireless connection between the test instrument 12 and the computing device 18, e.g. via Ethernet, Bluetooth, WLAN, 4G, and/or 5G.

In an embodiment, the dispatching circuit 30 is configured to process the alert signal and to generate at least one operator task based on the alert signal. In general, the at least one operator task generated comprises information on the external action required. For example, the at least one operator task may comprise information on individual steps that need to be performed. In some embodiments, the at least one operator task may comprise instructions for the actions that have to be performed.

In a certain example, the at least one operator task may comprise information on how the connecting components 16 have to be adapted, e.g. which cable has to be connected to which port of the device under test 14 and/or of the at least one test instrument 12. Alternatively or additionally, the at least one operator task may comprise information on the test instrument 12, such as an identification of the test instrument 12, operational parameters of the test instrument 12, and/or a location of the test instrument 12.

In an embodiment, the dispatching circuit 30 is configured to transmit the alert signal and the at least one operator task to the at least one electronic device 20, for example to exactly one electronic device 20. The alert signal and the at least one operator task may be transmitted by any suitable type of wired and/or wireless connection between the computing device 18 and the at least one electronic device 20, e.g. via Ethernet, Bluetooth, WLAN, 4G, and/or 5G.

In an embodiment, the dispatching circuit 30 may be configured to selectively transmit the alert signal and the at least one operator task to the at least one electronic device 20 based on at least one criterion. For example, the alert signal and the at least one operator task may first be transmitted to the electronic device 20 being closest to the test instrument 12. As another example, the alert signal and the at least one operator task may first be transmitted to the electronic device 20 having the lowest number of open operator tasks. In a further example, the at least one operator task may be transmitted to an electronic device 20 that is associated with a human operator having experience and/or specialized knowledge for the required external action associated with the at least one operator task.

As already mentioned above, the at least one electronic device 20 may be a mobile communication device of a human operator or an automated operator robot.

Figure 2:
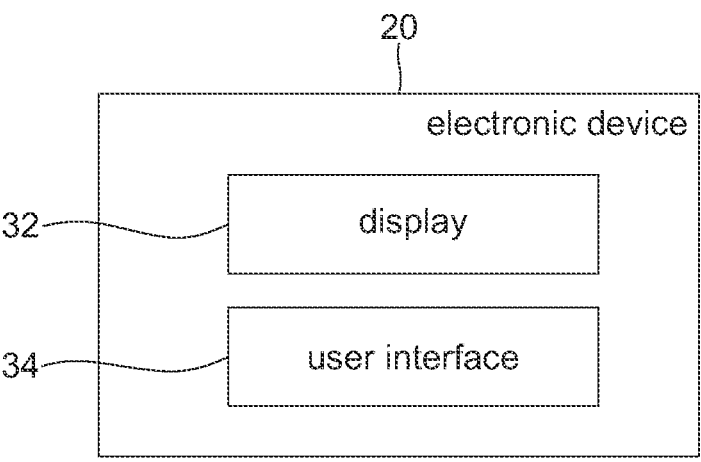
FIG. 2 schematically shows another embodiment of an electronic device of the measurement system of FIG. 1.

FIG. 2 schematically shows an example embodiment of the electronic device 20, such as a mobile communication device of an operator, an external computer device of an operator, or a shared screen. As shown in FIG. 2, the electronic device 20 comprises a user interface 32 and a display 34. The electronic device 20 is configured to display the alert signal and/or the at least one operator task on the display 34.

In an embodiment, the human operator can decide to accept the at least one operator task or to decline the at least one operator task via the user interface 32. Upon reception of the corresponding user input, the electronic device 20 sends information on whether the task has been accepted back to the dispatching circuit 30.

If the human operator declines the at least one operator task, the dispatching circuit 30 may transmit the at least one operator task to another electronic device 20. If the at least one operator task has neither been accepted nor declined by the human operator for a predetermined period of time, the dispatching circuit 30 may send a reminder message to the at least one electronic device 20, wherein the reminder message may be displayed on the display 34.

In an embodiment, the at least one electronic device 20 may further be configured to receive an operator input via the user interface 32, wherein the operator input indicates that the at least one operator task has been completed.

Upon reception of the operator input, the electronic device 20 generates a confirmation signal that is transmitted to the dispatching circuit 30 and/or to the at least one test instrument 12. Upon reception of the confirmation signal, the dispatching circuit 30 may delete the at least one completed operator task from a list of open operator tasks.

In an embodiment, the at least one test instrument 12 or the testing circuit 22 may be configured to perform a test step and/or a calibration step upon reception of the confirmation signal.

In other words, the at least one test instrument 12 may automatically resume a measurement or start a new measurement upon receiving the confirmation that the external action required for performing the measurement has been completed.

It is noted that it is also conceivable that the operator input confirming that the required external action has been completed may also be received by the at least one test instrument 12 directly, e.g. via a suitable user interface of the at least one test instrument 12.

Figure 3:
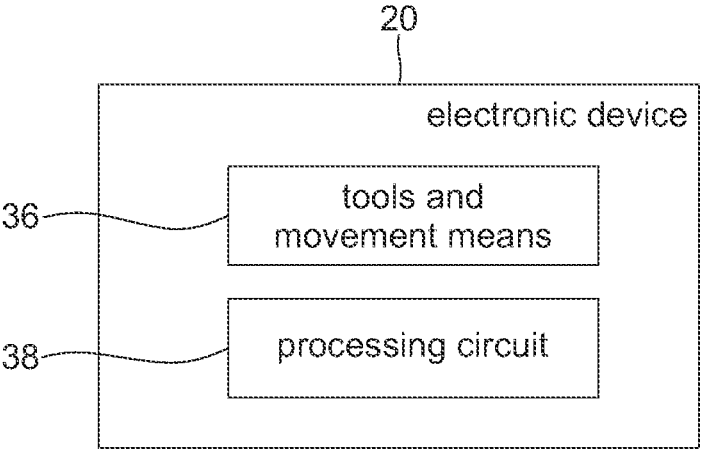
FIG. 3 schematically shows another embodiment of an electronic device of the measurement system of FIG. 1.

FIG. 3 schematically shows an example embodiment of the electronic device 20 being an automated operator robot. As shown in FIG. 3, the electronic device 20 comprises tools and movement means 36 as well as a processing circuit 38. In general, the tools and movement means 36 includes components allow the automated operator robot to interact with the at least one test instrument 12, the device under test 14, and/or the connecting components 16.

In some embodiments, the tools and movement means 36 may comprise movement means that are configure to move the automated operator robot or at least certain components of the automated operator robot. For example, the movement means may comprise an electric motor, wheels, a chain drive, a turntable, a conveyor belt, etc.

In an embodiment, the tools and movement means 36 may further comprise tools that allow the automated operator robot to modify the measurement setup of the measurement system 10. For example, the tools may comprise a robot arm that is configured to attach and detach cables from the at least one test instrument 12 and/or from the device under test 14. As another example, the tools may comprise input means, for example a robot arm or a wireless communication circuit, that are configured to operate the at least one test instrument 12 and/or the device under test 14, for example to set operational parameters of the at least one test instrument 12 and/or of the device under test 14.

In an embodiment, the processing circuit 38 is configured to process the alert signal and/or the at least one operator task received from the dispatching circuit 30. The processing circuit 38 may be further is configured to automatically accept the at least one operator task or to decline the at least one operator task.

In an embodiment, the electronic device 20 may send information on whether the task has been accepted back to the dispatching circuit 30. If the automated operator robot declines the at least one operator task, the dispatching circuit 30 may transmit the at least one operator task to another electronic device 20.

If the automated operator robot accepts the at least one operator task, the processing circuit 38 may automatically control the automated operator robot, for example the tools and movement means 36, to perform the external action required.

After the external action required has been performed, the at least one electronic device 20 or the processing circuit 38 may generate an operator input, wherein the operator input indicates that the at least one operator task has been completed. In an embodiment, the electronic device 20 or the processing circuit 38 may generate a confirmation signal that is transmitted to the dispatching circuit 30 and/or to the at least one test instrument 12.

Upon reception of the confirmation signal, the dispatching circuit 30 may delete the at least one completed operator task from a list of open operator tasks.

In an embodiment, the at least one test instrument 12 or the testing circuit 22 may be configured to perform a test step and/or a calibration step upon reception of the confirmation signal.

In other words, the at least one test instrument 12 may automatically resume a measurement or start a new measurement upon receiving the confirmation that the external action required for performing the measurement has been completed.

Figure 4:
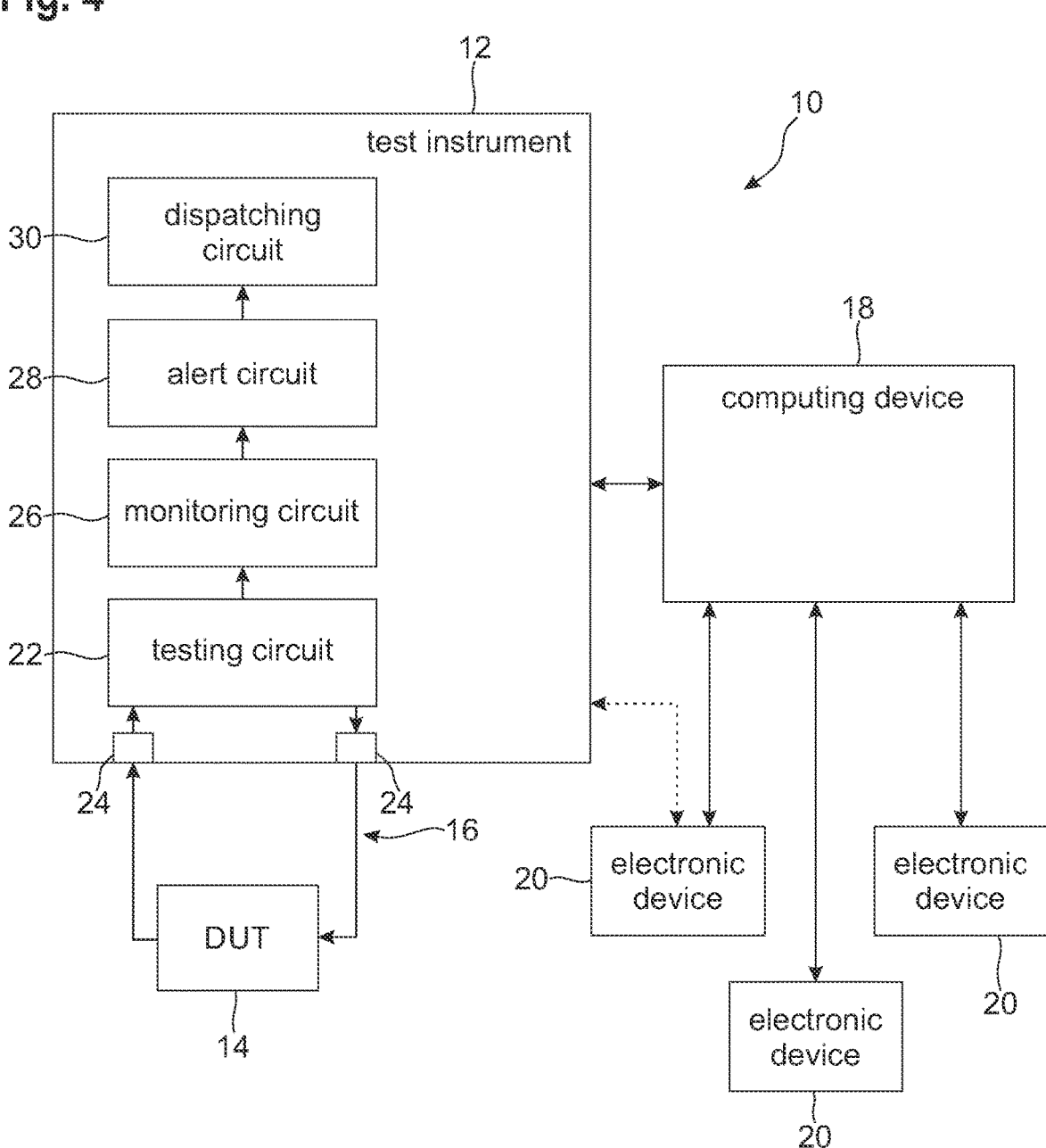
FIG. 4 shows another embodiment of a measurement system according to the present disclosure.

FIG. 4 shows another embodiment of a measurement system 10, wherein only the differences compared to the embodiment of the measurement system 10 described above with regard to FIG. 1 are explained hereinafter.

In this embodiment, the dispatching circuit 30 is integrated into the at least one test instrument 12. Accordingly, the at least one test instrument 12 or the dispatching circuit 30 integrated into the at least one test instrument 12 is configured to generate the at least one operator task described above. Further, the at least one test instrument 12 or the dispatching circuit 30 integrated into the at least one test instrument 12 is configured to perform the other functionalities of the dispatching circuit 30 described above.

Therein, the dispatching circuit 30 is configured to communicate with the at least one electronic device 20 directly or indirectly. In other words, the alert signal, the at least one operator task, the confirmation signal and/or other signals may be exchanged between the dispatching circuit 30 of the test instrument 12 and the at least one electronic device 20 directly by any suitable type of wired or wireless connection, for example via Ethernet, Bluetooth, WLAN, 4G, and/or 5G. In this case, the computing device 18 is not necessary.

Alternatively or additionally, the alert signal, the at least one operator task, the confirmation signal and/or other signals may be exchanged between the dispatching circuit 30 of the test instrument 12 and the at least one electronic device 20 indirectly via the computing device 18. In other words, the computing device 18 is interconnected between the at least one test instrument 12 and the at least one electronic device 20. The computing device 18 is configured to forward signals from the at least one test instrument 12 to the at least one electronic device 20 and vice versa.

Certain embodiments disclosed herein include systems, apparatus, modules, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In an embodiment, one or more of the components, such as the monitoring circuit, the dispatching circuit, the alert circuit, the testing circuit, the processing circuit, the electronic devices, the test instrument, the device under test, the computing device, etc., referenced above include circuitry programmed to carry out one or more steps of any of the methods disclosed herein or imprement the technologies disclosed herein. In some embodiments, one or more computer-readable media associated with or accessible by such circuitry contains computer readable instructions embodied thereon that, when executed by such circuitry, cause the component or circuitry to perform one or more steps of any of the methods or imprement the technologies disclosed herein.

In an embodiment, the computer readable instructions include applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement system, comprising:
at least one electronic device;
at least one test instrument comprising a testing circuit, wherein the testing circuit is configured to conduct measurements on a measurement signal received from a device under test and/or to generate a test signal for the device under test;
a monitoring circuit configured to monitor a status of the at least one test instrument, wherein the status is associated with a measurement being performed on the device under test, wherein the monitoring circuit is configured to generate an alert signal if a status change of the at least one test instrument requiring an external action is detected, and
a dispatching circuit configured to transmit the alert signal to the at least one electronic device,
wherein the at least one electronic device is established separately from the at least one test instrument, wherein the dispatching circuit is configured to generate at least one operator task if the status change of the at least one test instrument requiring the external action is detected,
wherein the dispatching circuit is configured to transmit the at least one operator task to the at least one electronic device,
wherein the at least one electronic device is configured to receive or generate an operator input, the operator input indicating that the at least one operator task has been completed, and wherein the at least one electronic device is configured to generate a confirmation signal based on the operator input, and
wherein the at least one test instrument is configured to perform a test step or a calibration step based on the confirmation signal.

2. The measurement system of claim 1, wherein the at least one test instrument comprises the monitoring circuit.

3. The measurement system of claim 1, wherein the at least one electronic device comprises a mobile communication device of an operator, an external computer device of an operator, or a shared screen.

4. The measurement system of claim 1, wherein the at least one electronic device comprises an automated operator robot capable of performing the action required.

5. The measurement system of claim 1, wherein the at least one test instrument comprises an alert circuit, wherein the alert circuit is configured to generate a visual alert or an acoustic alert based on the alert signal.

6. The measurement system of claim 1, wherein the at least one electronic device is configured to display the at least one operator task.

7. The measurement system of claim 1, wherein the at least one electronic device is configured to receive a user input, the user input indicating whether the at least one operator task is accepted or declined.

8. The measurement system of claim 7, wherein the dispatching circuit is configured to transmit the at least one operator task to at least one further electronic device if the at least one operator task is declined.

9. The measurement system of claim 1, wherein the at least one test instrument is configured to receive an operator input, the operator input indicating that the at least one operator task has been completed, and wherein the at least one test instrument is configured to generate a confirmation signal based on the operator input.

10. The measurement system of claim 1, wherein the at least one electronic device is an automated operator robot, and wherein the automated operator robot is configured to automatically perform the at least one operator task.

11. The measurement system of claim 1, wherein the dispatching circuit is configured to transmit the at least one operator task to the at least one electronic device based on at least one criterion.

12. The measurement system of claim 11, wherein the at least one criterion relates to a distance of the at least one electronic device from the at least one test instrument, to a number of open tasks of the at least electronic device, or to a user of the at least one electronic device.

13. The measurement system of claim 1, wherein the dispatching circuit is integrated into the at least one test instrument.

14. The measurement system of claim 13, wherein the dispatching circuit is configured to transmit the alert signal to the at least one electronic device directly or indirectly.

15. The measurement system of claim 1, further comprising at least one computing device, wherein the dispatching circuit is integrated into the at least one computing device.

16. The measurement system of claim 1, wherein the at least one test instrument comprises a vector network analyzer.

\* \* \* \* \*